United States Patent [19]

Hamasaki

[11] Patent Number: 4,460,956
[45] Date of Patent: Jul. 17, 1984

[54] RECTIFYING DEVICE

[75] Inventor: Yoshihiro Hamasaki, Hyogo, Japan

[73] Assignee: Mitsubishi Denki Kabushiki Kaisha, Tokyo, Japan

[21] Appl. No.: 387,893

[22] Filed: Jun. 14, 1982

[30] Foreign Application Priority Data

Jun. 15, 1981 [JP] Japan .............................. 56-88483[U]

[51] Int. Cl.³ .......................................... H01L 23/34
[52] U.S. Cl. .................................... 363/141; 363/125; 363/144; 357/82
[58] Field of Search ................ 363/141, 144, 125, 126; 361/379, 381–384, 388, 389; 357/80–82, 84

[56] References Cited

U.S. PATENT DOCUMENTS 3,005,945 10/1961 Salzer .............................. 363/141 X
3,942,586 3/1976 Fries ................................. 357/82 X

FOREIGN PATENT DOCUMENTS 1182352 11/1964 Fed. Rep. of Germany ...... 363/141

Primary Examiner—Peter S. Wong
Attorney, Agent, or Firm—Sughrue, Mion, Zinn, Macpeak and Seas

[57] ABSTRACT

A rectifying device is improved by arranging heat exchanging cooling pieces positioned on either side of the rectifying element in series with respect to a flow direction of cooling air circulating through the device. A sleeve element may cover the cooling pieces and the rectifier for channelling the air and reducing the spacing required between adjacent rectifier elements.

5 Claims, 5 Drawing Figures

RECTIFYING DEVICE

BACKGROUND OF THE INVENTION

This invention relates to an improvement in an air cooled heavy current rectifying device utilizing, for instance, a number of rectifying elements.

FIG. 1 is a circuit diagram of one phase (or one arm) of, for instance, a six phase rectifying circuit, and FIG. 2 is a plan view showing a practical construction of one phase of an air cooled heavy current rectifying device. In these figures, numeral 1 designates flat type rectifying elements, numeral 2 designates fuses, numerals 31 and 32 designate conductors, numeral 33 an AC terminal, and 34 a DC terminal. Numerals 35 and 36 designate connecting conductors, and numerals 41 and 42 designate a pair of cooling pieces secured to the rectifying element 1 on both sides thereof in face-contact manner, such that a sufficient amount of heat exchanging surface area can be obtained between the cooling pieces and outside air for dissipating the heat generated within the rectifying element, thereby preventing the same from an excessive temperature rise. Numeral 45 designate a securing frame used for clamping the rectifying element 1 between the pair of cooling pieces 41 and 42 under a predetermined pressure by means of a clamping screw 46. The frame also connects the element 1 and the pieces 41 and 42 thus clamped together to the conductor 31. Arrows A designate the direction of cooling air simultaneously passed through the cooling pieces 41 and 42 and the rectifying element 1 in a parallel manner for cooling these members.

In the conventional rectifying device constructed as described above, an input AC current flowing into the AC terminal 33 passes through the conductor 31, cooling piece 42, and the flat type rectifying element 1 to be rectified therein into a DC current. The DC current is then passed through the cooling piece 41, the connecting conductor 35, the fuse 2, the connecting conductor 36 and conductor 32 to be delivered from the DC terminal 34. Heat generated in the rectifying element 1 during the rectifying operation is conducted from the rectifying element 1 to the cooling pieces 41 and 42 provided on both sides thereof, so as to be dissipated into the cooling air passed through the cooling pieces 41 and 42 and the rectifying element 1 as described.

In the conventional rectifying device, since the cooling air is passed through the cooling pieces 41 and 42 simultaneously and in parallel as shown in FIG. 2, the quantity of cooling air required for cooling the entire rectifying device is equal to the product of the quantity of the air required for cooling one cooling piece times the number of cooling pieces provided in the rectifying device. For this reason, a large quantity of cooling air, for instance, 1,200 m³/min has been required for cooling a heavy current rectifying device having numerous rectifying elements and cooling pieces, such a feature inevitably increasing the size of the rectifying device.

SUMMARY OF THE INVENTION

The invention is directed to overcome the above described difficulty of in conventional rectifying device, and to provide a rectifying device wherein a pair of cooling pieces are arranged in series with respect to the flow direction of the cooling air, whereby the required quantity of the cooling air may be reduced to one half of the quantity required for the conventional device.

DETAILED DESCRIPTION OF THE PREFERRED EMBODIMENTS

Figure 1:
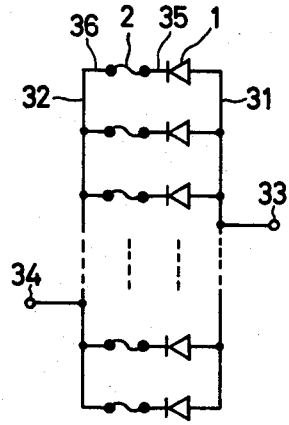
FIG. 1 is a circuit diagram showing a part corresponding to one phase of a six-phase rectifying circuit.
Figure 2:
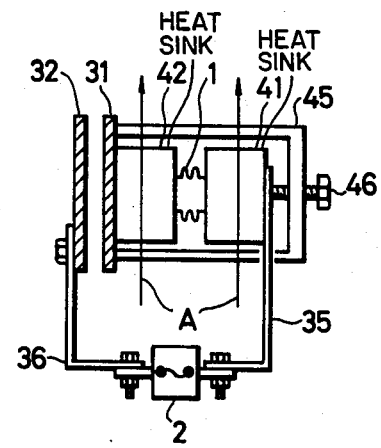
FIG. 2 is a plan view of a conventional rectifying device.
Figure 3:
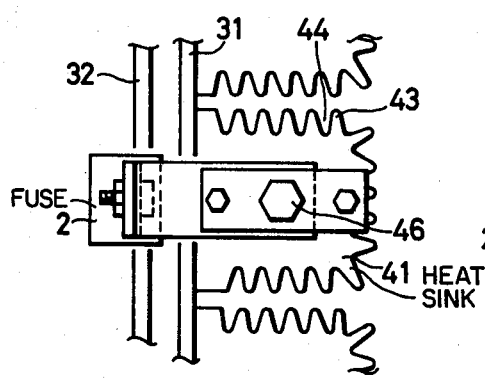
FIG. 3 is an elevational view of a rectifying device constituting a first embodiment of the present invention.
Figure 4:
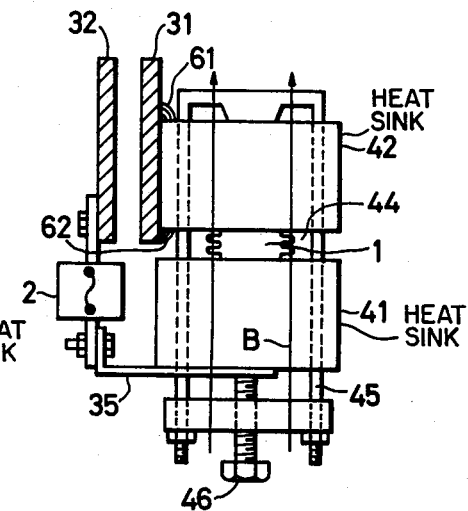
FIG. 4 is a plan view of the embodiment shown in FIG. 3.

FIGS. 3 and 4 illustrate a preferred embodiment of the present invention, wherein like parts in FIGS. 1 and 2 are designated by like reference numerals. The embodiment shown in FIGS. 3 and 4 differ from the conventional device shown in FIG. 2 in that one cooling piece 42 of the two cooling pieces 41 and 42 is welded to a conductor 31 at positions 61, while the other cooling piece 41 is arranged along the flow direction B of the cooling air in series with the cooling piece 42. The cooling pieces 41 and 42 are assembled by a securing frame 45 having two legs, with a rectifying element 1 interposed therebetween, and are clamped to each other with a predetermined pressure by a clamping screw 46. A plurality of cooling fins 43 are further provided on the outer surfaces of the cooling pieces 41 and 42 in a direction parallel to the flow direction B of the cooling air, and a plurality of passages 44 are provided between the fins 43 for permitting cooling air to circulate therethrough.

Figure 5:
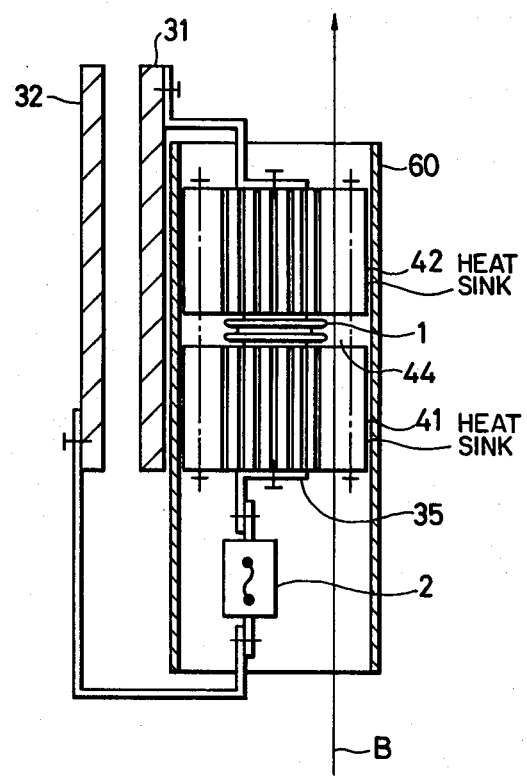
FIG. 5 is a plan view of another embodiment of the present invention.

FIG. 5 illustrates another embodiment of the present invention wherein an insulating sleeve 60 is provided around a series connected assembly comprising the cooling pieces 41 and 42 and the rectifying element 1, and a fuse 2 connected in series with this assembly, such that the insulating sleeve 60 covers four sides of the assembly and the fuse 2. With the above described construction, the embodiment shown in FIG. 5 exhibits a number of advantageous features. Firstly, the insulating sleeve 60 acts as a guiding duct through which cooling air B is effectively guided into the surfaces of the cooling pieces 41 and 42.

The insulating sleeve also insulates the series arranged assembly contained therein from other such assemblies, and prevents any problem such as the blowing of a fuse hampering the operation of the other phases of the rectifying device. The insulating sleeve further eliminates the requirement of maintaining an air insulating distance between two adjacent series arranged assemblies, and more particularly between the cooling pieces of these assemblies, and advantageous features such as a reduction in the pitch between the series arranged assemblies, minimization of the size of the rectifying device, and an improvement in the current carrying capacity of the parallel connected rectifying elements can be thereby achieved.

Ordinarily, a heavy current rectifying device includes six or twelve arms closely adjacent each other. According to the second embodiment of the invention, there is no necessity of maintaining a specific air insulating distance between these arms, and therefore the pitch or the distance between the arms can be reduced. Such a feature in turn reduces not only the size of the entire device but also the lengths of the conductors interconnecting different phases, thus entailing another advantage in that the commutation impedance of the rectifying device can be reduced. Furthermore, since a voltage drop due to the reactance of the rectifying device is also reduced in accordance with the reduction of the lengths of the conductors, the capacity of a transformer supplying power to the rectifying device can be reduced, and the power factor of the transformer can thereby be improved. The reduction of the lengths of the conductors further reduces the magnitude of the electromagnetic field thereby created, and also reduces the range affected by the electromagnetic field within a casing of the rectifying device. This feature in turn reduces heat generated by the electromagnetic field, and further reduces the size of the rectifying device.

In either of the embodiments of the present invention, a pair of cooling pieces are placed on both sides of a rectifying element 1 in a series manner in the flow direction of the cooling air. Thus, as shown in FIG. 4, the cooling air is firstly brought into contact, for instance, with the cooling piece 41 and initiates a heat-exchange to cool the same piece. The air is thereafter passed through the passage 44 to be brought into contact with the cooling piece 42 for cooling the same.

As a result, the quantity of cooling air required in these embodiments is reduced to one half that required in the conventional arrangement wherein the cooling pieces 41 and 42 are disposed in parallel with the flow direction A of the cooling air. That is, the quantity of cooling air required in these embodiments is made equal to one-half the air quantity required for cooling one of the cooling pieces times the number of cooling pieces. The reduction of the required cooling air to one half not only reduces the construction cost of blowers and the like, but also reduces the lateral size of the rectifying device by half because the cooling pieces 41 and 42 are arranged in series in the flow direction of the air. In other words, according to the present invention, the operation, safety, and economy of a heavy current rectifying device can be substantially improved.

What is claimed is:
1. A rectifying device, comprising:
    a conductor (31);
    first cooling means (42) electrically connected to and rigidly secured in parallel to said conductor;
    a securing frame (45) secured to said first cooling means;
    a second cooling means (41) secured to said frame;
    a rectifying element (1) disposed between said first and second cooling means in series with respect to a direction of cooling air flowing through said rectifier, said air flow being parallel to the line of attachment of said first cooling means to said conductor; and
    screw means attached to said frame for pressing said second cooling means and said rectifying element toward said first cooling means.
2. A rectifying device as set forth in claim 1, further including a plurality of heat-radiating fins attached to said cooling means formed parallel to said flow direction of said cooling air.
3. A rectifying device as set forth in claim 1, including cooling air passages formed between said two cooling means.
4. A rectifying device as set forth in claim 1, further including an insulating sleeve (60) for encasing both said cooling means.
5. A rectifying device as set forth in claim 4, further including a fuse (2) arranged serially with said rectifying element, said sleeve extending about said fuse.

* * * * *